United States Patent
Bringivijayaraghavan et al.

(10) Patent No.: US 10,510,384 B2
(45) Date of Patent: Dec. 17, 2019

(54) INTRACYCLE BITLINE RESTORE IN HIGH PERFORMANCE MEMORY

(71) Applicant: GLOBALFOUNDRIES INC., Grand Cayman (KY)

(72) Inventors: Venkatraghavan Bringivijayaraghavan, Cheyyar (IN); George M. Braceras, Essex Junction, VT (US)

(73) Assignee: GLOBALFOUNDRIES U.S. INC., Santa Clara, CA (US)

(*) Notice: Subject to any disclaimer, the term of this patent is extended or adjusted under 35 U.S.C. 154(b) by 0 days.

(21) Appl. No.: 15/814,969

(22) Filed: Nov. 16, 2017

(65) Prior Publication Data

US 2019/0147924 A1 May 16, 2019

(51) Int. Cl.
| | |
|---|---|
| G11C 11/419 | (2006.01) |
| G11C 7/12 | (2006.01) |
| G11C 11/4074 | (2006.01) |
| H04L 5/22 | (2006.01) |
| G11C 11/406 | (2006.01) |
| G11C 11/56 | (2006.01) |

(52) U.S. Cl.
CPC ............. *G11C 7/12* (2013.01); *G11C 11/406* (2013.01); *G11C 11/4074* (2013.01); *G11C 11/419* (2013.01); *H04L 5/22* (2013.01); *G11C 11/56* (2013.01)

(58) Field of Classification Search
CPC ..... G11C 7/12; G11C 11/406; G11C 11/4074; G11C 11/56; G11C 11/4085; G11C 11/4091
See application file for complete search history.

(56) References Cited

U.S. PATENT DOCUMENTS

| 3,699,539 | A | * | 10/1972 | Spence | G11C 11/405 327/200 |
|---|---|---|---|---|---|
| 5,233,560 | A | * | 8/1993 | Foss | G11C 11/4094 365/149 |
| 5,828,612 | A | * | 10/1998 | Yu | G11C 7/12 365/203 |
| 5,850,367 | A | | 12/1998 | Wada et al. | |
| 7,586,806 | B2 | | 9/2009 | Wong | |
| 7,626,878 | B1 | | 12/2009 | Lin et al. | |
| 7,679,948 | B2 | | 3/2010 | Kim et al. | |

(Continued)

FOREIGN PATENT DOCUMENTS

TW 201301293 1/2013

OTHER PUBLICATIONS

Taiwanese Office Action dated Oct. 2, 2018 in related TW Application No. 107107003, 11 pages.

(Continued)

*Primary Examiner* — Khamdan N. Alrobaie
(74) *Attorney, Agent, or Firm* — Michael Le Strange; Andrew M. Calderon; Roberts Mlotkowski Safran Cole & Calderon, P.C.

(57) ABSTRACT

The present disclosure relates to a structure which includes at least one bit line restore device which is configured to precharge a bit line to a specified voltage during an intracycle time between a read operation and a write operation and is configured to be turned off during the read operation and the write operation.

13 Claims, 9 Drawing Sheets

(56) References Cited

U.S. PATENT DOCUMENTS

| | | | |
|---|---|---|---|
| 7,839,713 B1 * | 11/2010 | Yu | G11C 5/147 |
| | | | 365/189.16 |
| 7,936,624 B2 | 5/2011 | Clinton | |
| 8,325,512 B2 | 12/2012 | Chuang et al. | |
| 8,363,453 B2 | 1/2013 | Arsovski et al. | |
| 8,648,654 B1 | 2/2014 | Myers et al. | |
| 8,953,401 B2 | 2/2015 | Chen | |
| 9,570,155 B2 | 2/2017 | Braceras et al. | |
| 9,824,749 B1 | 11/2017 | Nautiyal et al. | |
| 2005/0063238 A1 * | 3/2005 | Nambu | G11C 11/406 |
| | | | 365/222 |
| 2005/0078508 A1 | 4/2005 | Chan et al. | |
| 2005/0152199 A1 * | 7/2005 | Park | G11C 7/18 |
| | | | 365/222 |
| 2007/0058421 A1 | 3/2007 | Chan et al. | |
| 2011/0149662 A1 | 6/2011 | Batra et al. | |
| 2015/0131368 A1 | 5/2015 | Adams et al. | |
| 2016/0365139 A1 | 12/2016 | Braceras et al. | |

OTHER PUBLICATIONS

Office Action dated Dec. 12, 2018 in related U.S. Appl. No. 15/903,826, 19 pages.
Taiwanese Notice of Allowance dated Jan. 28, 2019 in related TW Application No. 107107003, 4 pages.
Final Office Action dated Apr. 22, 2019 in related U.S. Appl. No. 15/903,826, 23 pages.
Notice of Allowance dated Aug. 28, 2019 in related U.S. Appl. No. 15/903,826, 8 pages.

* cited by examiner

INTRACYCLE BITLINE RESTORE IN HIGH PERFORMANCE MEMORY

FIELD OF THE INVENTION

The present disclosure relates to an intracycle bit line restore scheme, and more particularly, to an intracycle bit line restore scheme for a time division multiplexed static random access memory (TD SRAM).

BACKGROUND

Memory chips comprise an array of memory cells which are interconnected by bitlines and wordlines. The word lines and bit lines are used to read and write binary values to each of the memory cells, where each of the memory cells represents a bit of information. Since each memory cell represents a bit of information and may be connected to other circuitry, it is desirable that the electrical and operational characteristics of all memory cells be consistent.

In time division multiplexed static random access memory (TD SRAM), one of the primary cycle time limiters is restoring a bit line (BL) during the read and write intracycle time period. During the intracycle time period, the BL needs to be restored to stabilize half selected (HS) cells for the write operation. Further, even in a selected cell (i.e., where the write operation takes place), the BL needs to be restored to prevent a write issue where both the true BL and complement BL are discharged to ground.

SUMMARY

In an aspect of the disclosure, a structure includes at least one bit line restore device which is configured to precharge a bit line to a specified voltage during an intracycle time between a read operation and a write operation and is configured to be turned off during the read operation and the write operation.

In another aspect of the disclosure, a structure includes at least one bit line restore device which is configured to restore a bit line of a half selected cell during an intracycle time between a read operation and a write operation and is configured to condition a selected cell for the write operation during the intracycle time.

In another aspect of the disclosure, a method includes turning off a bit line restore device during a read operation, precharging a bit line to a voltage difference between a voltage value of a power supply signal and a threshold voltage of a transistor in the bit line restore device; and turning off the bit line restore device during a write operation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to an intracycle bit line restore scheme, and more particularly, to an intracycle bit line restore scheme for a time division multiplexed static random access memory (TD SRAM). Advantageously, by implementing the circuit disclosed herein, the cycle time and stability concern for half selected cells is improved in the TD SRAM. The intracycle column dependent bit line restore for the half selected cells can also enable a low voltage operation.

Figure 1:
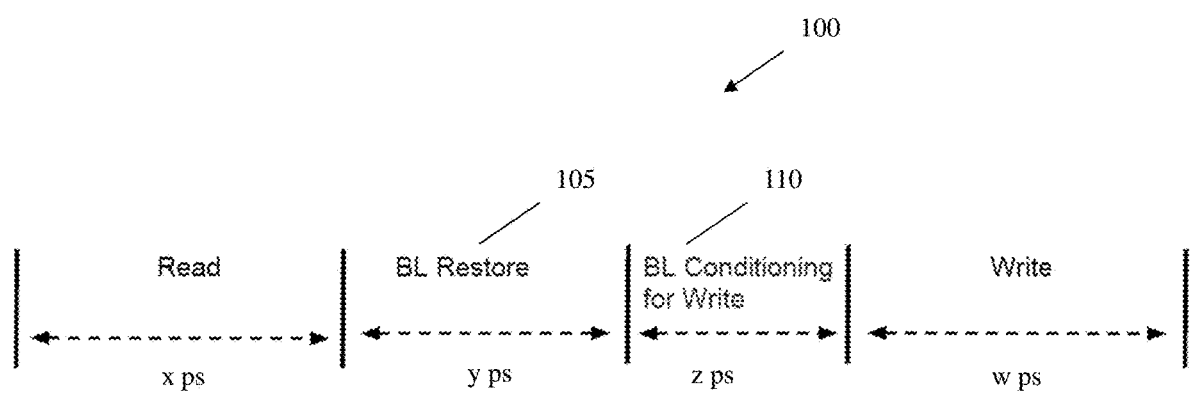
FIG. 1 shows a time division multiplexed static random access memory (TDM SRAM) timeline.

FIG. 1 shows a time division multiplexed static random access memory (TDM SRAM) timeline. In FIG. 1, a conventional TDM SRAM timeline 100 has read, restore, conditioning, and write operations. For example, a read operation takes approximately x picoseconds, a bit line (BL) restore operation takes approximately y picoseconds, and a bit line (BL) conditioning for a write operation takes approximately z picoseconds. Finally, the write operation itself takes approximately w picoseconds. In the conventional TDM SRAM timeline 100, the BL restore operation of y picoseconds can prevent a stability issue of half selected (HS) cells during a write operation when restoring the BL. Further, for a selected column in the conventional TDM SRAM timeline 100, the BL restore helps a write operation by restoring the read BL that went low (i.e., otherwise, the write operation will have an issue in which both the true and complement BL will be low). Also, in the conventional TDM SRAM timeline 100, the BL conditioning for the write operation conditions the BL for a write operation by pulling down the writing BL low. In this scenario, the other BL (i.e., the non-writing BL) is already high. Therefore, the BL condition for the write operation prevents an early read operation.

In order to improve the conventional TDM SRAM timeline 100, the circuits provided herein can hide the BL restore operation 105 while the BL conditioning is occurring for a write 110. In embodiments this occurs with the following exemplary steps. In a first step, the stability of half selected cells of the write operation is addressed by precharging a BL. In a second step, a write issue in which both bit lines can be low is addressed by restoring the BL. In a third step, write operations are conditioned by pulling one side of the bit line low. In a fourth step, write operations are condition by pulling the other side of the bit line high.

In further embodiments of the present disclosure, the BL restore happens for only the half selected (HS) cells of the write operation. This scenario happens with the following exemplary steps. In a first step, the stability of half selected (HS) cells of a write operation is addressed by restoring the BL. In the second step, write operations are conditioned by pulling one side of the bit line low and pulling the other side of the bit line high in tandem (i.e., at the same time).

Figure 2:
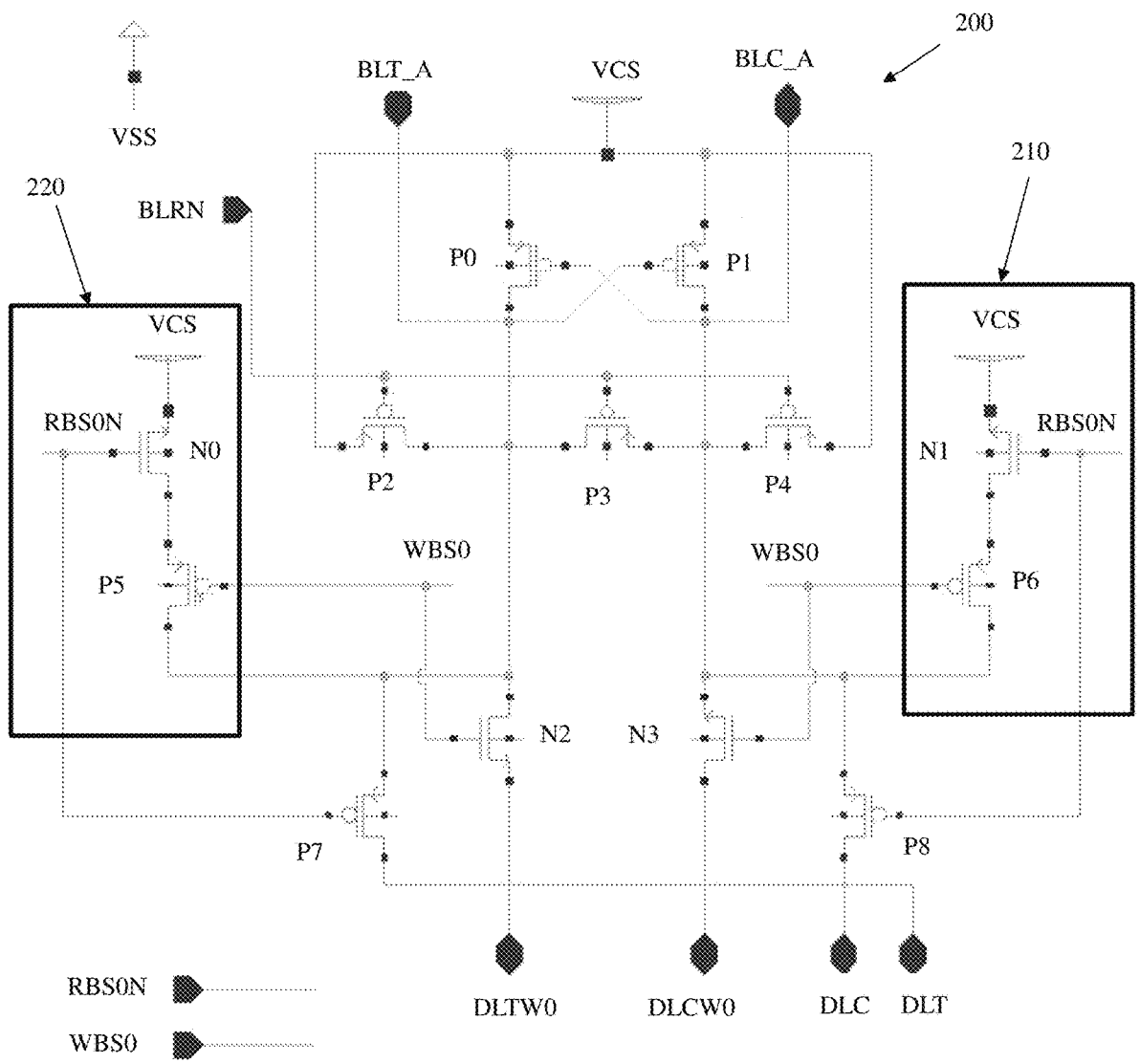
FIG. 2 shows an intracycle pseudo bit line restore for half selected cell structures in accordance with aspects of the present disclosure.

FIG. 2 shows an intracycle pseudo bit line restore for half selected cell structures in accordance with aspects of the present disclosure. In FIG. 2, the half selected cell structures 200 comprises the following components: PMOS transistors P0-P8; NMOS transistors N0-N3; a power supply signal VCS; a true bit line signal BLT_A; a complement bit line signal BLC_A; a digit line true write signal DLTW0; a digit line complement write signal DLCW0; a digit line complement signal DLC; a digit line true signal DLT; a read bit switch signal RBS0N; a write bit switch signal WBS0; a bit line restore signal BLRN, and a power supply signal VSS. In embodiments, the PMOS transistors P0 and P1 are cross-coupled and the PMOS transistors P2, P3, and P4 are in series and are gated with the bit line restore signal BLRN. Further, the following components are in series: PMOS transistor P5 and NMOS transistor N0; PMOS transistor P6 and NMOS transistor N1; PMOS transistor P0 and NMOS transistor N2; and PMOS transistor P1 and NMOS transistor N3. Moreover, PMOS transistors P7 and P8 are gated with the read bit switch signal RBS0N.

A first bit line restore device 210 comprises the NMOS transistor N1, the PMOS transistor P6, the power supply signal VCS, the read bit switch signal RBS0N, and the write bit switch signal WBS0. Further, a second bit line restore device 220 comprises the NMOS transistor N0, the PMOS transistor P5, the power supply signal VCS, the read bit switch signal RBS0N, and the write bit switch signal WBS0. The pseudo bit line restore devices 210, 220 are gated by the read bit switch signal RBS0N and the write bit switch signal WBS0 of the corresponding bit lines. Further, one of ordinary skill in the art would understand that the order of the pseudo bit line restore devices 210, 220 can be interchanged (e.g., the order of the NMOS transistors N0, N1 in series with PMOS transistors P5, P6). During read and write operations, the pseudo bit line restore devices 210, 220 are turned off for the half selected (HS) cells, and for the half selected (HS) cells, the pseudo restore devices 210, 220 are on which precharges the bit line (BL) to VCS-Vt (i.e., the threshold voltage) based on the NMOS transistors N0, N1. In embodiments, the NMOS transistors N0, N1 restrict a maximum restore value to VCS-Vt and mitigates the stability issue to reduce intracycle time.

In embodiments, at the end of the read and write cycle, the bit line (BL) will be fully restored because the pseudo bit line restore devices 210, 220 are turned off. By allowing the BL (e.g., BLT_A and BLC_A) to be partially restored allows the write operation to start immediately after the read. In particular, the BL of the selected cell can be evaluated for the write operation as there is no intracycle bit line restore operation.

In embodiments, between the read and write operations, when the read bit switch signal RBS0N resets, and prior to enabling the write bit switch signal WBS0, the selected read column is partially restored to VCS-Vt. Restoring the selected write column to VCS-Vt is performed because a known write operation will have difficulty to overcome a cross-coupled PMOS transistor of the BL (i.e., if the selected write column was not restored to VCS-Vt). Therefore, the circuit of FIG. 2 enables faster cycle time for time division multiplexed (TDM) memory.

In embodiments, an extra margin adjustment (EMA) option can be given to clamp the selected BL even during read operations to restrict the BL signal development. When using the EMA option, the write driver will overcome the BL cross coupled devices and pull down the BL for a next write operation.

Figure 3:
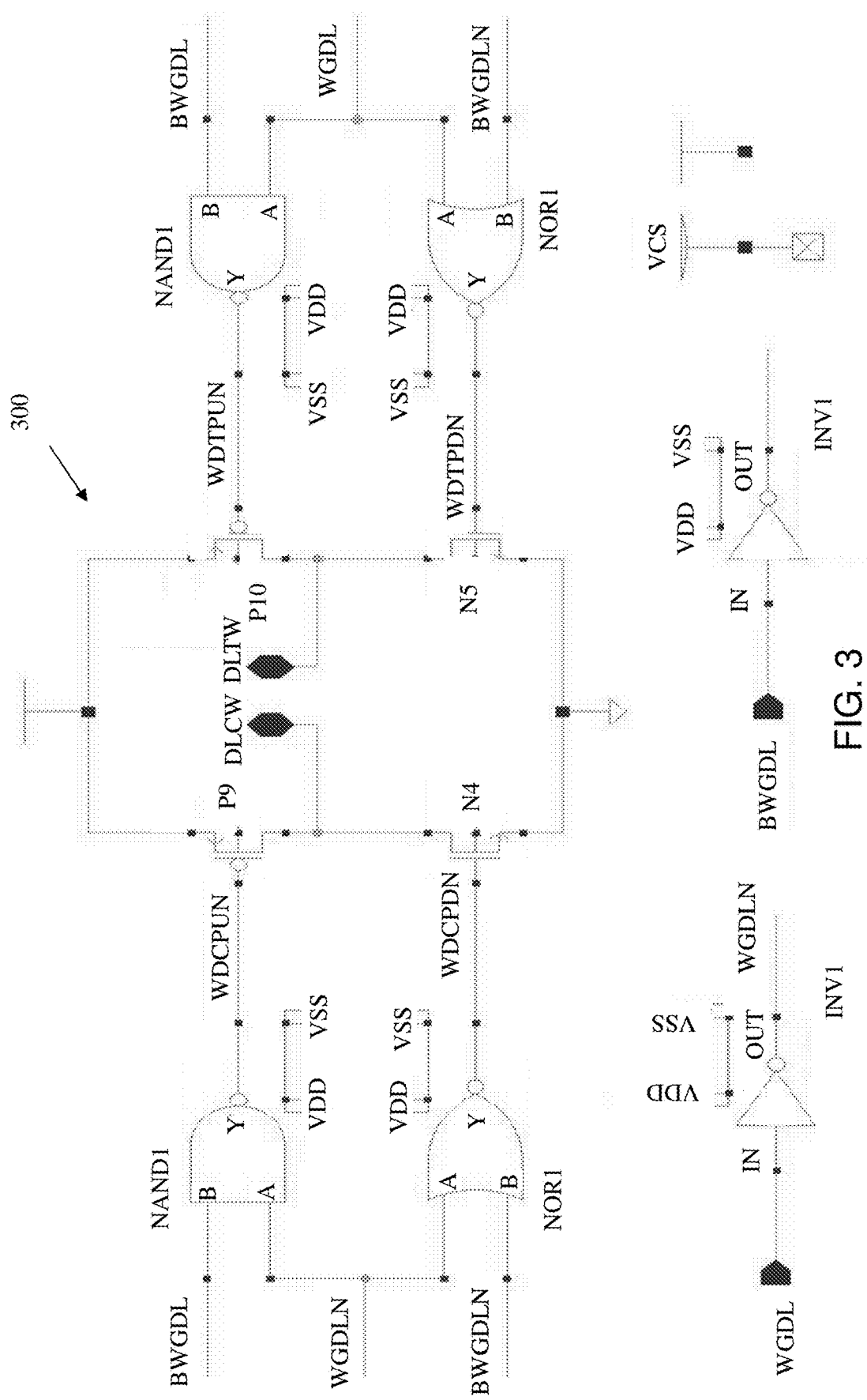
FIG. 3 shows a true and complement write driver for the half selected cell structures in accordance with aspects of the present disclosure.

FIG. 3 shows a true and complement write driver for the half selected cell structures in accordance with aspects of the present disclosure. In FIG. 3, the true and complement write driver 300 comprises the following components: PMOS transistors P9 and P10; NMOS transistors N4 and N5; inverters INV1; NAND logic gates NAND1; NOR logic gates NOR1; a digit line true write signal DLTW; a digit line complement signal DLCW; a write global data line signal WGDL; a complement write global data line signal WGDLN; a bit write global data line signal BWDGL; a complement bit write global data line signal BWDGLN; a power supply signal VCS; a power supply signal VSS; a write driver complement pull up signal WDCPUN; a write driver complement pull down signal WDCPDN; a write driver true pull up signal WDTPUN; and a write driver true pull down signal WDTPDN. The following components are in series: the PMOS transistor P9 and NMOS transistor N4; and the PMOS transistor P10 and NMOS transistor N5. The NAND logic gates NAND1 output the write driver complement pull up signal WDCPUN to a gate of PMOS transistor P9 and the write driver true pull up signal WDTPUN to a gate of PMOS transistor P10. The NOR logic gates NOR1 output the write driver complement pull down signal WDCPDN to a gate of NMOS transistor N4 and the write driver true pull down signal WDTPDN to a gate of NMOS transistor N5. The inverters INV1 invert the write global data line signal WGDL and the bit write global data line signal BWDGL and output the complement write global data signal WGDLN and the complement bit write global data line signal BWDGLN, respectively.

Still referring to FIG. 3, the true and complement write driver 300 is utilized such that one of the bit lines (BLs) is pulled to ground by overcoming the cross coupled PMOS of the BL whose gate is at VCS-Vt. The PMOS device in the write driver drives one of the DLTW/DLCW signals and the corresponding BL to VCS-Vt until the cross coupled PMOS of the BL kicks in and restores the BL to the power supply signal VCS. In particular, the PMOS device in the write driver improves performance by reducing a dip in the BL due to charge sharing with DLTW/DLCW signal. The write driver is off when the bit write/bit mask is low (i.e., a bit write/bit mask=0).

In FIG. 3, when a bit write=0 (i.e., bit mask=0), both the PMOS and NMOS transistors of the write drivers will be off. In this situation, the write driver will have a same voltage supply as the BL restore devices. Further, the DLTW and DLCW signals will be floating and a write operation won't take place.

In FIGS. 2 and 3, an intracycle pseudo bit line restore scheme is provided wherein a bit line (BL) of half selected cells is partially restored during an intracycle time period such that there is no stability concern for the half selected cells. For the selected cells (i.e., where the write operation will take place), the write driver will be a true and complement write driver to pull one of the bit lines (BLs) to ground and the other BL will be pulled towards VCS (i.e., a power supply). At the end of the read and write cycle, the BL will be fully restored. Further, the intracycle pseudo bit line restore for the half selected cells can concurrently occur with the write conditioning operation and improve the cycle time.

Figure 4:
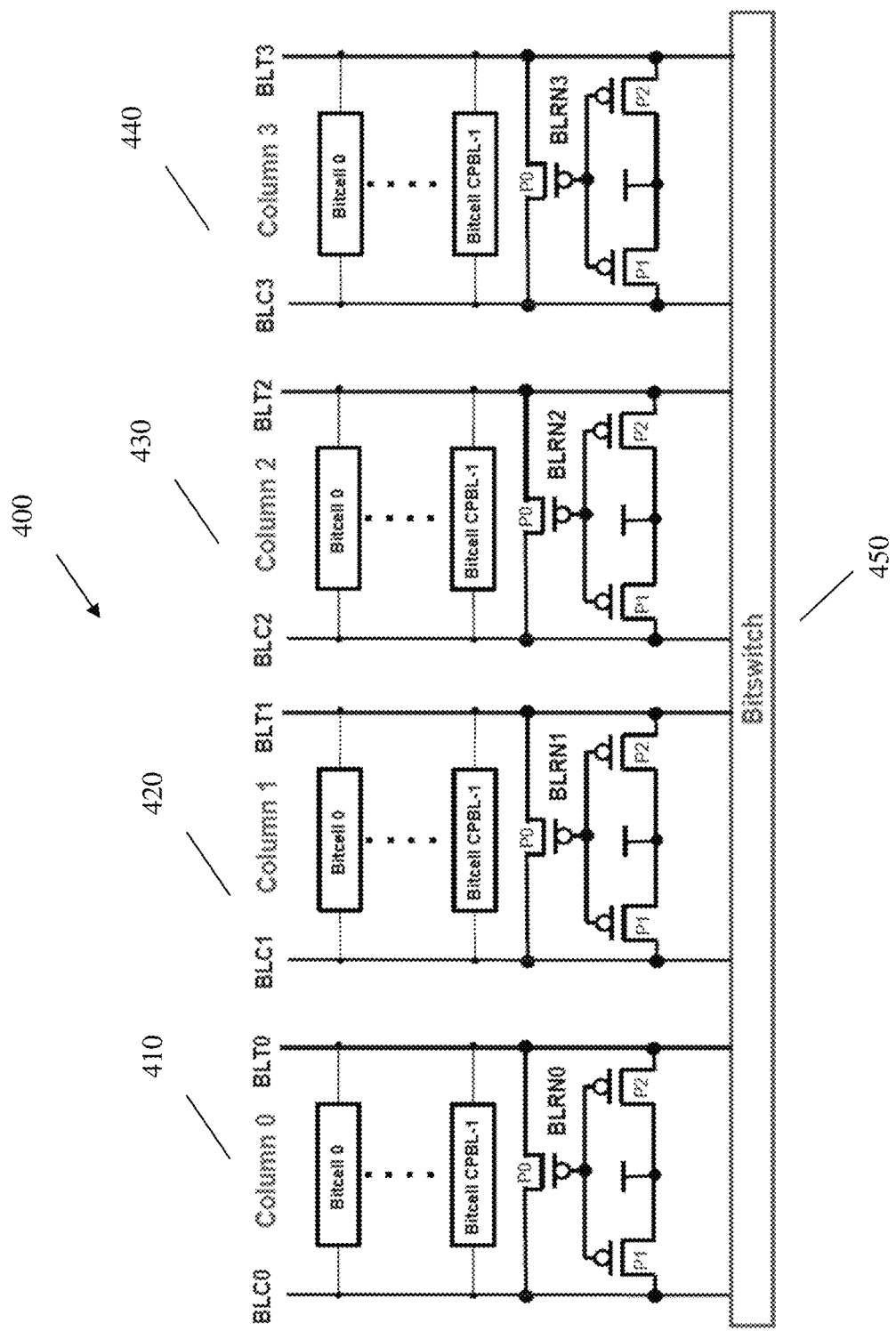
FIG. 4 shows an intracycle column dependent bit line restore structure in accordance with aspects of the present disclosure.

FIG. 4 shows an intracycle column dependent bit line restore structure in accordance with aspects of the present disclosure. In FIG. 4, each of the columns 410, 420, 430, and 440 (i.e., column 0, column 1, column 2, column 3, respectively) of the intracycle column dependent bit line restore structure 400 have their own bit line (BL) restore device, which includes PMOS transistors P0, P1, and P2. In addition, each of the columns 410, 420, 430, and 440 (i.e., column 0, column 1, column 2, column 3, etc.) have a complement bit line (i.e., BLC0, BLC1, BLC2, BLC3) and a true bit line (i.e., BLT0, BLT1, BLT2, and BLT3). Further, each of the columns 410, 420, 430, and 440 have a plurality of bitcells (i.e., bitcell 0 to bitcell CPBL−1) which are each connected to a bit switch 450. During intracycle, BL for the selected column for writes will not be restored, but will be conditioned for a write operation. Further, during the intracycle, while the BL for the selected column will be conditioned for a write operation, half selected columns will be restored. Thus, when the write line WL is activated, all of the bit line restore signals (BLRNs) will be released.

Still referring to FIG. 4, the embodiments of the present disclosure take advantage of the intentional write line WL delay to restore the half selected (HS) bit line (BL). Further, at the end of the read and write cycle, all of the BLs will be restored, which ensures the stability of the half selected (HS) cells during both read and write operations. Further, the write driver of FIG. 4 will include a true write driver and a complement write driver to pull one of the BLs to ground and the other BL towards the power supply VCS. Therefore, there is a concurrent operation of BL restore for the HS cells and the BL.

Figure 5:
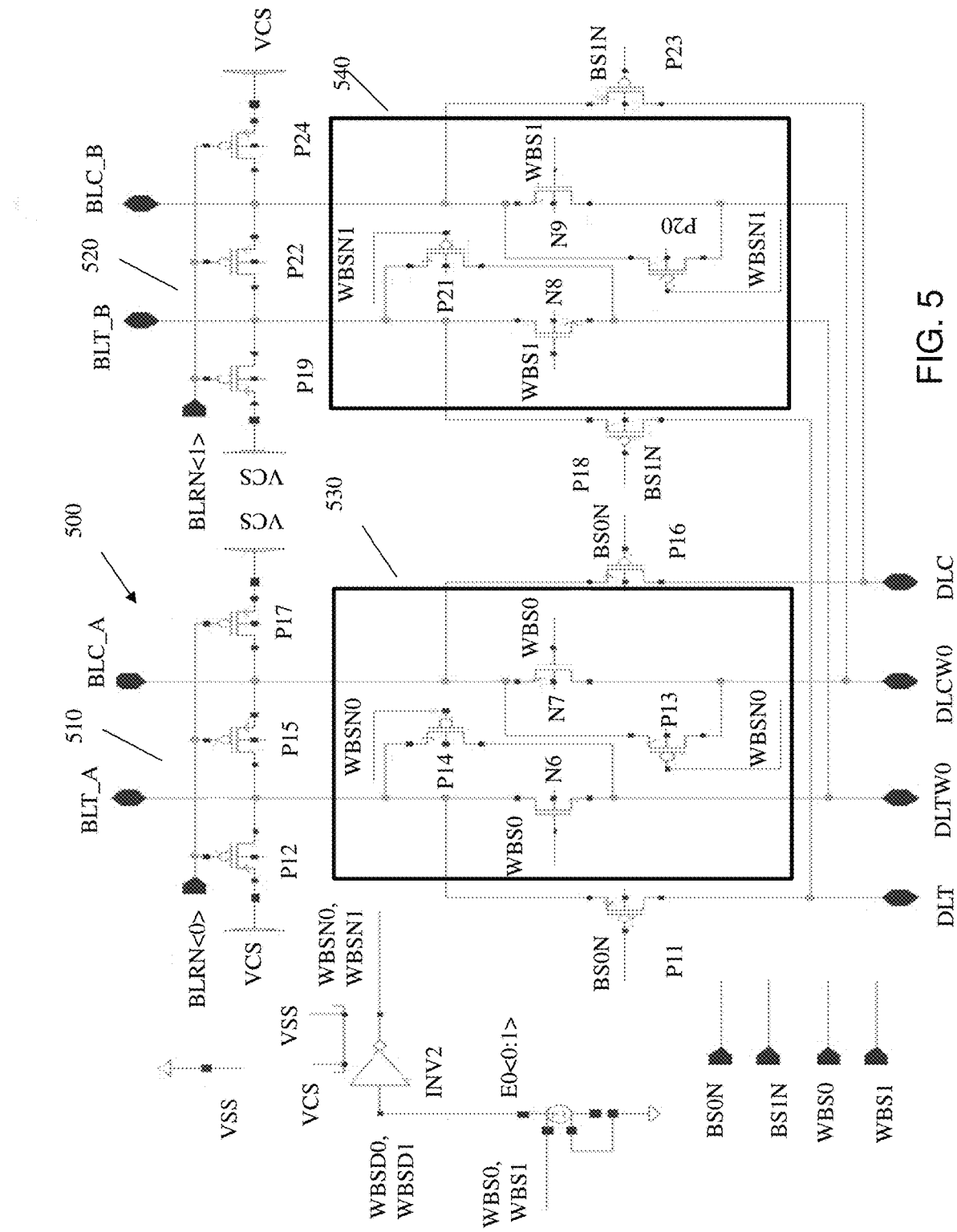
FIG. 5 shows a bit switch with a pass gate structure for the intracycle column dependent bit line restore structure in accordance with aspects of the present disclosure.

FIG. 5 shows a bit switch with a pass gate structure for the intracycle column dependent bit line restore structure in accordance with aspects of the present disclosure. In FIG. 5, the intracycle column dependent bit line restore structure 500 includes: PMOS transistors P11-P24; NMOS transistors N6-N9; an inverter INV2; a power supply signal VCS; a power supply signal VSS; a true bit line BLT_A for a first column 510; a complement bit line BLT_A for the first column 510; a true bit line BLT_B for a second column 520; a complement bit line BLT_B for the second column 520; bit switches 530, 540; a write bit switch signal WBS0 for the first column 510; a complement write bit switch signal WBSN0 for the first column 510; a write bit switch signal WBS1 for the second column 520; a complement write bit switch signal WBSN1 for the second column 520; a bit line restore signal BLRN<0> for the first column 510; a bit line restore signal BLRN<1> for the second column 520; a bit switch signal BS0N for the first column 510; a bit switch signal BS1N for the second column 520; a node E0<0:1>; a digit line true signal DLT; a digit line complement signal DLC; a digit line true write signal DLTW0; and a digit line complement write signal DLCW0.

Still referring to FIG. 5, PMOS transistors P12, P15, and P17 are in series and are gated by the bit line restore signal BLRN<0> for the first column 510. Further, PMOS transistors P19, P22, and P24 are in series and are gated by the bit line restore signal BLRN<1> for the second column 520. In addition, PMOS transistors P11 and P16 are gated by the bit switch signal BS0N for the first column 510, NMOS transistors N6 and N7 are gated by the write bit switch signal WBS0 for the first column 510, and PMOS transistors P13 and P14 are gated by the complement write bit switch signal WBSN0 for the first column 510. Further, PMOS transistors P18 and P23 are gated by the bit switch signal BS1N for the second column 520, NMOS transistors N8 and N9 are gated by the write bit switch signal WBS1 for the second column 520, and PMOS transistors P20 and P21 are gated by the complement write bit switch signal WBSN1 for the second column 520. Lastly, inverter INV2 inverts the write bit switch data signals WBSD0, WBSD1 and outputs the complement write bit switch signal WBSN0 for the first column 510 and the complement write bit switch signal WBSN1 for the second column 520.

In FIG. 5, the bit switch 530 (similar to the bit switch 450 in FIG. 4) is included in the intracycle column dependent bit line restore structure 500. In embodiments, the bit switch 530 of FIG. 5 is a pass gate instead of a simple NMOS in conventional architectures. In particular, the bit switch 530 includes NMOS transistors N6 and N7 and PMOS transistors P13 and P14 for a first column (i.e., column 510). In FIG. 5, the BL cross couple is eliminated from the bit switch 530. Further, the write driver will drive both the true bit line (BLT) and the complement bit line (BLC) of the selected column. Another bit switch 540 is included for a second column (i.e., column 520) and includes NMOS transistors N8 and N9 and PMOS transistors P20 and P21. The bit switch 540 for the second column 520 performs in a similar manner as the bit switch 530.

Still referring to FIG. 5, the intracycle column dependent bit line restore structure 500 includes columns 510 and 520 (i.e., column 0 and column 1, respectively). Further, similar to PMOS transistors P0, P1, and P2 in FIG. 4, PMOS transistors P12, P15, and P17 comprise a bit line (BL) restore device for column 510 (i.e., column 0). PMOS transistors P19, P22, and P24 also comprise a BL restore device for column 520 (i.e., column 1). In FIG. 5, during an intracycle, the BL for the selected column will be conditioned for a write operation while the half selected (HS) columns will be restored. Therefore, the HS cells will be stable during both read and write operations. Further, at the end of the read and write cycle, all of the BLs will be restored.

Figure 6:
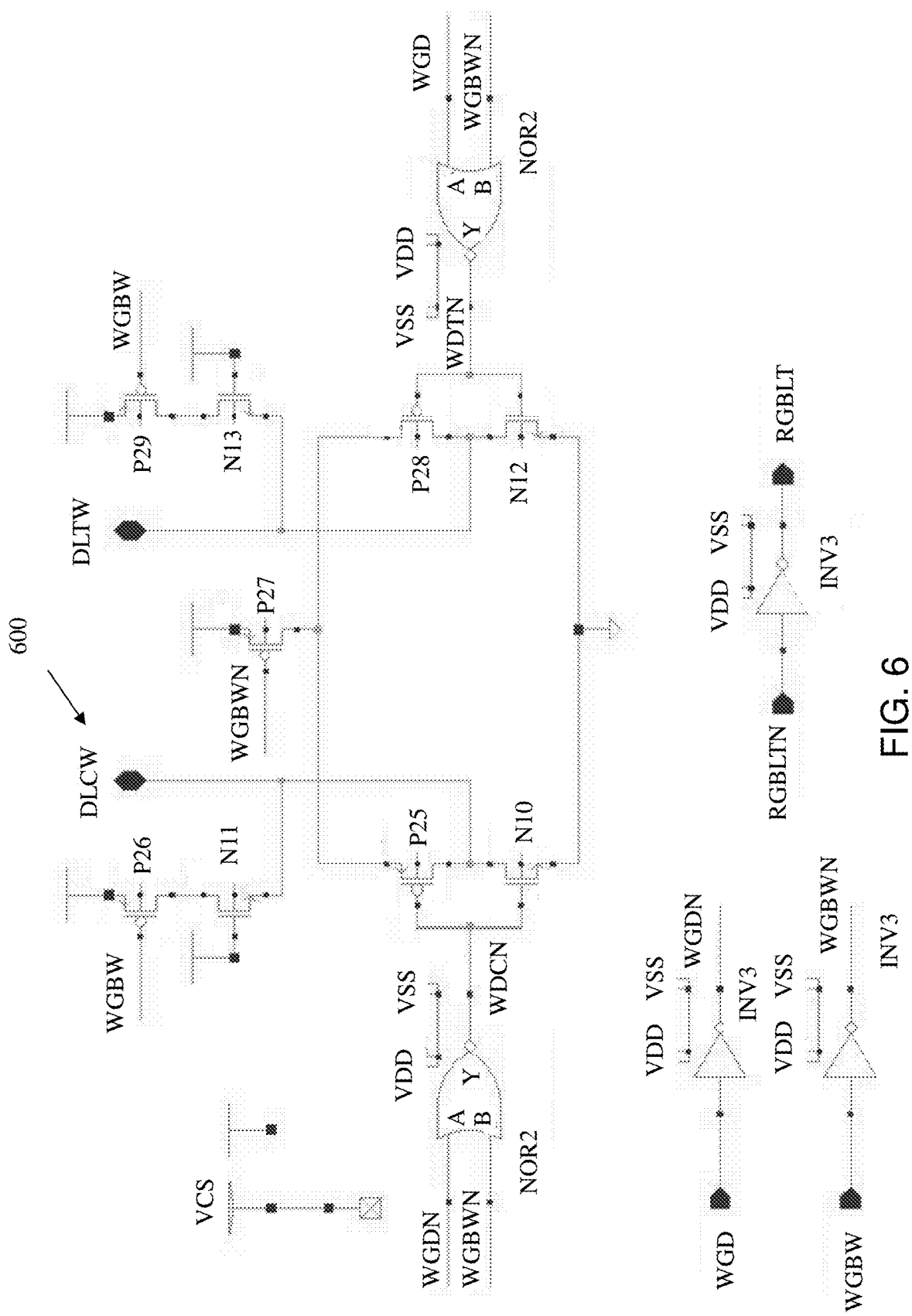
FIG. 6 shows a true and complement write driver for the intracycle column dependent bit line restore structure in accordance with aspects of the present disclosure.

FIG. 6 shows a true and complement write driver for the intracycle column dependent bit line restore structure in accordance with aspects of the present disclosure. In FIG. 6, the true and complement write driver 600 comprises: PMOS transistors P25-P29; NMOS transistors N10-N13; a power supply signal VSS; another power supply signal VDD; NOR logic gates NOR2; inverters INV3; a digit line true write signal DLTW; a digit line complement write signal DLCW; a write global data signal WGD; a complement write global data signal WGDN; a write global bit write signal WGBW; a complement write global bit write signal WGBWN; a write driver complement signal WDCN; a write driver true signal WDTN; a read global bit line true signal RGBLT; and a complement read global bit line signal RGBLTN. The following components are in series: PMOS transistor P25 and NMOS transistor N10; PMOS transistor P26 and NMOS transistor N11; PMOS transistor P28 and NMOS transistor N12; and PMOS transistor P29 and NMOS transistor N13. PMOS transistor P27 is gated by the complement write global bit write signal WGBWN. Further, NOR logic gates NOR2 output the write driver complement signal WDCN to the gates of NMOS transistor N10 and PMOS transistor P25 and the write driver true signal WDTN to the gates of NMOS transistor N12 and PMOS transistor P28. Lastly, inverters INV3 invert the write global data signal WGD, the write global bit write signal WGBW, and the complement read global bit line signal RGBLTN and output the complement write global data signal WGDN, the complement write global bit write signal WGBWN, and the read global bit line true signal RGBLT, respectively.

In conventional TDM SRAM, in a read and write cycle, during a read operation, if the bit line (BL) discharges deeply (i.e., has a large voltage discharge), then it might be a challenge to perform a write operation in the next cycle as there is no intracycle restore operation (i.e., both the true and complement BL may be at ground). In contrast, in embodiments of the present disclosure as shown in FIG. 6, a true and complement write driver is used such that one of the bit lines (BLs) is pulled to ground and the other bit line is pulled to the power supply VCS (i.e., when the bit write/bit mask=1). Hence, the cross coupled PMOS in the conventional TDM SRAM is eliminated. This prevents both the true and complement BL being at ground.

Still referring to FIG. 6, when the bit write=0 (i.e., bit mask=0), both the true and complement write drivers will be off and the DLTW and DLCW signals will be clamped to VCS-Vt. In this situation, the write driver will have a same voltage supply as the BL restore devices. Accordingly, stability is increased because the bit line is restored to VCS-Vt instead of being kept at ground.

In FIGS. 4-6, an intracycle column dependent bit line restore scheme is disclosed in which the bit line (BL) of half selected cells is restored during the intracycle time period such that there is no stability concern for the half selected cells. For the selected cells (i.e., where the write operation will take place), the write driver will be a true and complement write driver to pull one of the bit lines (BLs) to ground and the other BL will be pulled towards VCS (i.e., a power supply). At the end of the read and write cycle, the BL will be fully restored. Further, the intracycle column dependent bit line restore for the half selected cells can concurrently occur with the write operation and improve the cycle time.

Figure 7:
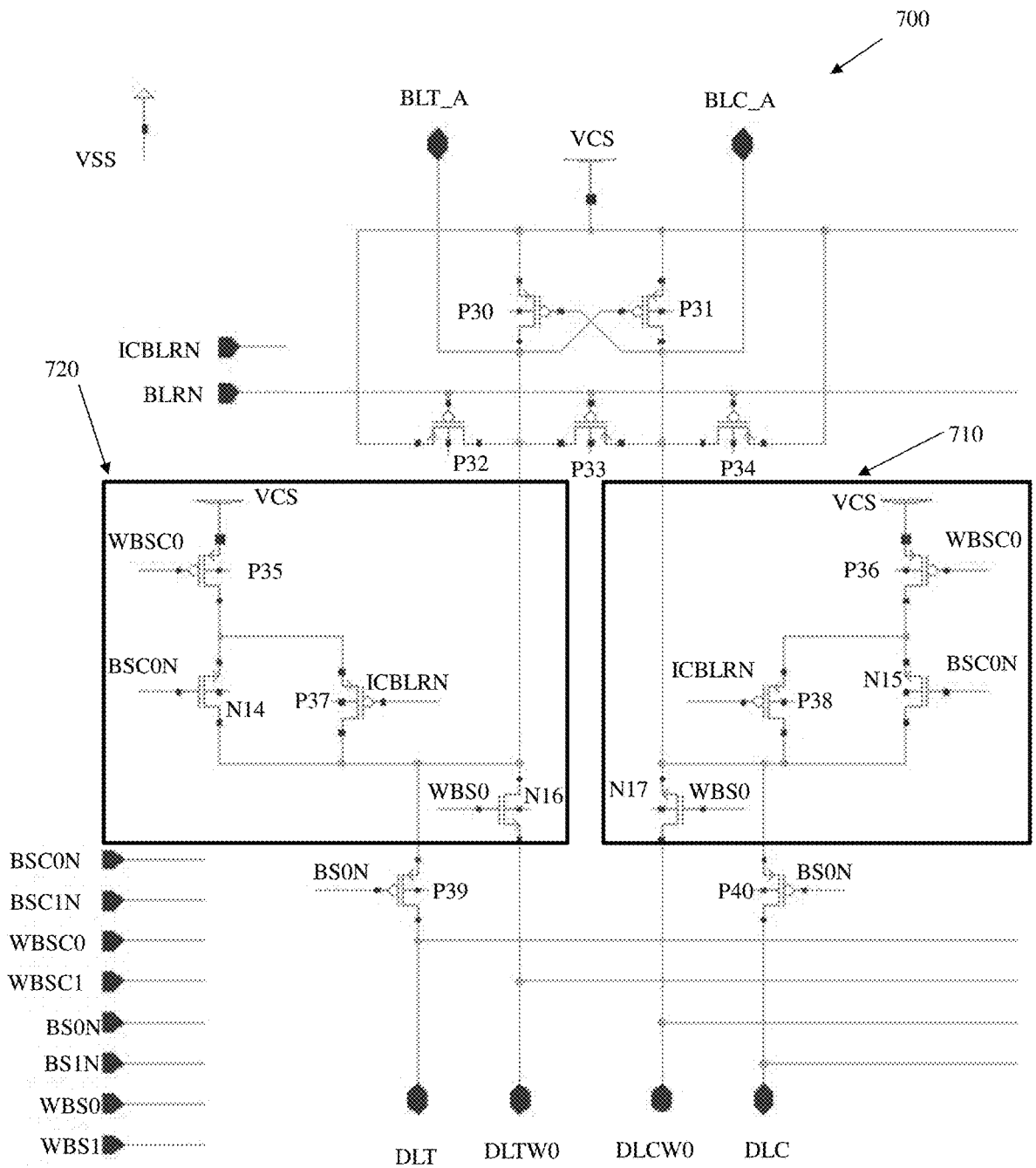
FIG. 7 shows another intracycle restore for half selected cell structures in accordance with aspects of the present disclosure.

FIG. 7 shows an intracycle restore for half selected cell structures in accordance with aspects of the present disclosure. In FIG. 7, the half selected cell structures 700 includes PMOS transistor P30 cross-coupled with PMOS transistor P31. Further, in FIG. 7, PMOS transistors P32, P33, and P34 are in series and are gated with the bit line restore signal BLRN. A first bit line restore device 710 includes PMOS transistor P36 in series with NMOS transistor N15. Further, the NMOS transistor N15 is in parallel with PMOS transistor P38. The first bit line restore device 710 also includes NMOS transistor N17 in series with the PMOS transistor P31. In the first bit line restore device 710, the PMOS transistor P36 is gated with a write bit switch complement signal WBSC0, the NMOS transistor N15 is gated with a bit switch complement signal BSC0N, the PMOS transistor P38 is gated with an intracycle bit line restore signal ICBLRN, and the NMOS transistor N17 is gated with a write bit switch signal WBS0.

A second bit line restore device 720 includes PMOS transistor P35 in series with NMOS transistor N14. Further, the NMOS transistor N14 is in parallel with PMOS transistor P37. The second bit line restore device 720 also includes NMOS transistor N16 in series with the PMOS transistor P30. In the second bit line restore device 720, the PMOS transistor P35 is gated with the write bit switch complement signal WBSC0, the NMOS transistor N14 is gated with the bit switch complement signal BSC0N, the PMOS transistor P37 is gated with the intracycle bit line restore signal ICBLRN, and the NMOS transistor N16 is gated with the write bit switch signal WBS0. Lastly, the PMOS transistors P39 and P40 are gated with the bit switch signal BS0N.

The pseudo bit line restore devices 710, 720 are gated by the write bit switch complement signal WBSC0 and the bit switch signal complement signal BSC0N of the corresponding bit lines. During read and write operations, the pseudo bit line restore devices 710, 720 are turned off for the half selected (HS) cells, and for the half selected (HS) cells, the pseudo bit line restore devices 710, 720 are on which precharges the bit line (BL) to VCS-Vt (i.e., the threshold voltage) based on the NMOS transistors N14, N15.

In embodiments, at the end of the read and write cycle, the bit line (BL) will be fully restored and the pseudo bit line restore devices 710, 720 are turned on along with the BLRN devices. By allowing the BL (e.g., BLT_A and BLC_A) to be partially restored allows the write operation to start immediately after the read. In particular, the BL of the selected cell can be evaluated for the write operation as there is no intracycle bit line restore operation.

In further embodiments, between the read and write operations, when the bit switch complement signal BSC0N resets, and prior to enabling the write bit switch complement signal WBSC0, the selected read column is partially restored to VCS-Vt. Restoring the selected write column to VCS-Vt is performed because a known write operation will have difficulty to overcome a cross-coupled PMOS transistor of the BL (i.e., if the selected write column was not restored to VCS-Vt). Therefore, the circuit of FIG. 7 enables faster cycle time for time divisional multiplexed (TDM) memory).

In embodiments, an extra margin adjustment (EMA) option can be given to clamp the selected BL even during read operations to restrict the BL signal development. When using the EMA option, the write driver will overcome the BL cross coupled devices and pull down the BL for a next write operation.

In embodiments, during an intracycle, a BL for the selected column will be conditioned for a write operation and only half selected (HS) columns will be restored. Further, the intracycle bit line restore signal ICBLRN envelopes the read and write line (RWL) and the write word line (WWL). Therefore, the intracycle bit line restore signal ICBLRN is low during intracycle and it restores the bitlines of the half selected column while the selected column is conditioned for the write operation.

Figure 8:
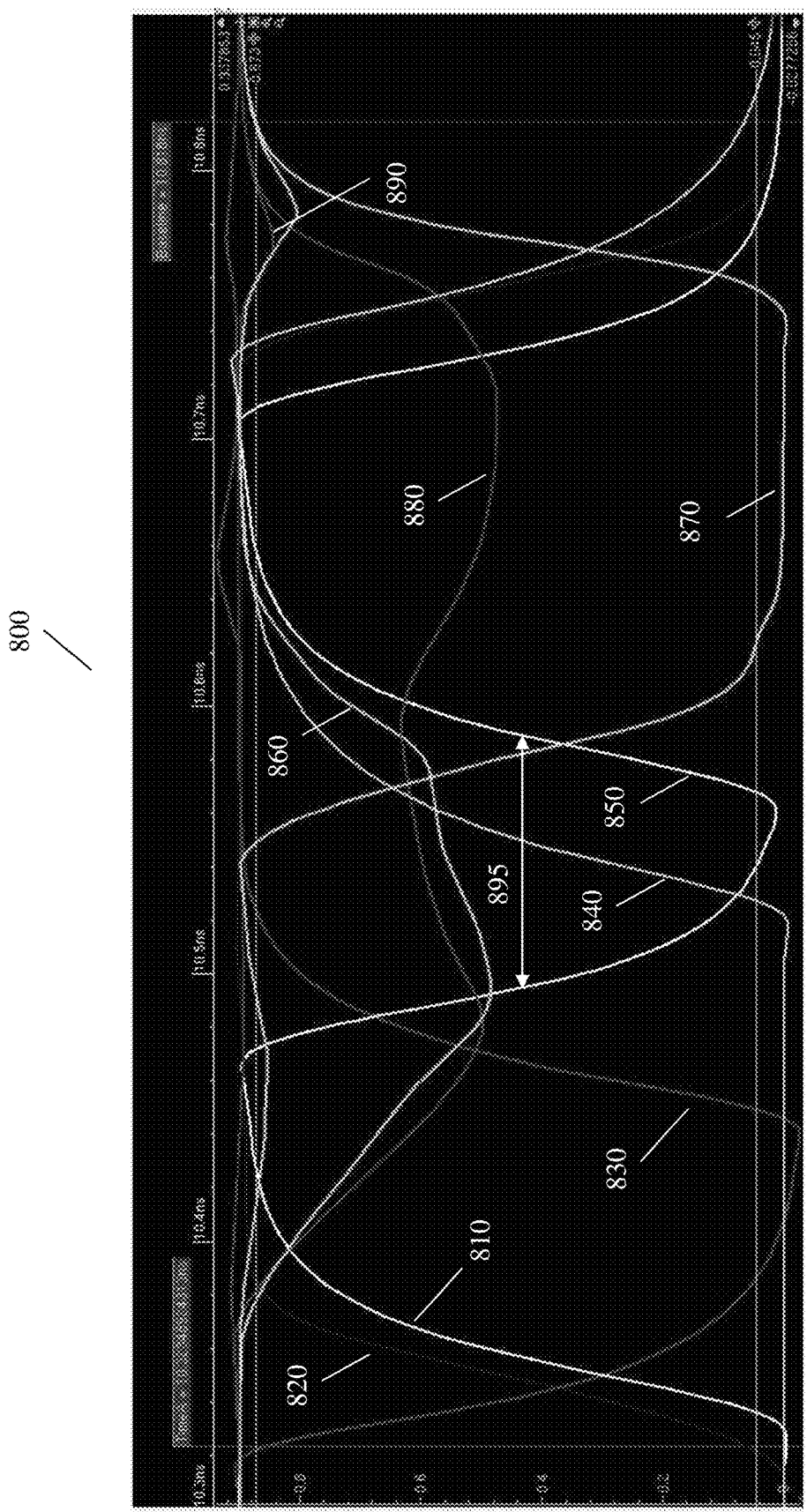
FIG. 8 shows a graph of the intracycle pseudo bit line restore for half selected cells structure in accordance with aspects of the present disclosure.

FIG. 8 shows a graph of the intracycle pseudo bit line restore for half selected cells structure in accordance with aspects of the present disclosure. In particular, the graph 800 of the intracycle pseudo bit line restore for half selected cell structure (i.e., which corresponds to FIGS. 2 and 3) has an x-axis of nanoseconds and a y-axis of voltage.

In particular, the graph 800 includes the following lines: a read and write line (RWL) 810; a bit line restore signal (BLRN) 820; a read bit switch signal (RBS0N) 830; a write bit switch signal (WBS0) 840; a write word line (WWL) 850; a complement bit line (BLC0) 860 of a first column; a true bit line (BLT0) 870 of a first column; a complement bit line (BLC1) 880 of a second column; and a true bit line (BLT1) 890 of a second column. In FIG. 7, the graph 800 of the intracycle pseudo bit line restore for half selected cells shows that a clamp restores the read bit line (i.e., BLC0 860) to VCS-Vt. Further, the write word line (i.e., WWL 850) has no intentional delay. The complement bit line (i.e., BLC1 880) shows a pseudo bit line restore for half selected (HS) cells.

The graph 800 also shows a full bit line restore at the end of the cycle. Further, the graph 800 of the intracyle pseudo bit line restore for half selected cells shows a 99 picosecond cycle time 895 in comparison to conventional systems with a 211 picosecond cycle time. In graph 800, the total cycle time is 495 picoseconds. Thus, the graph 800 discloses that a faster cycle time is enabled in the intracyle pseudo bit line restore for half selected cells structure.

Figure 9:
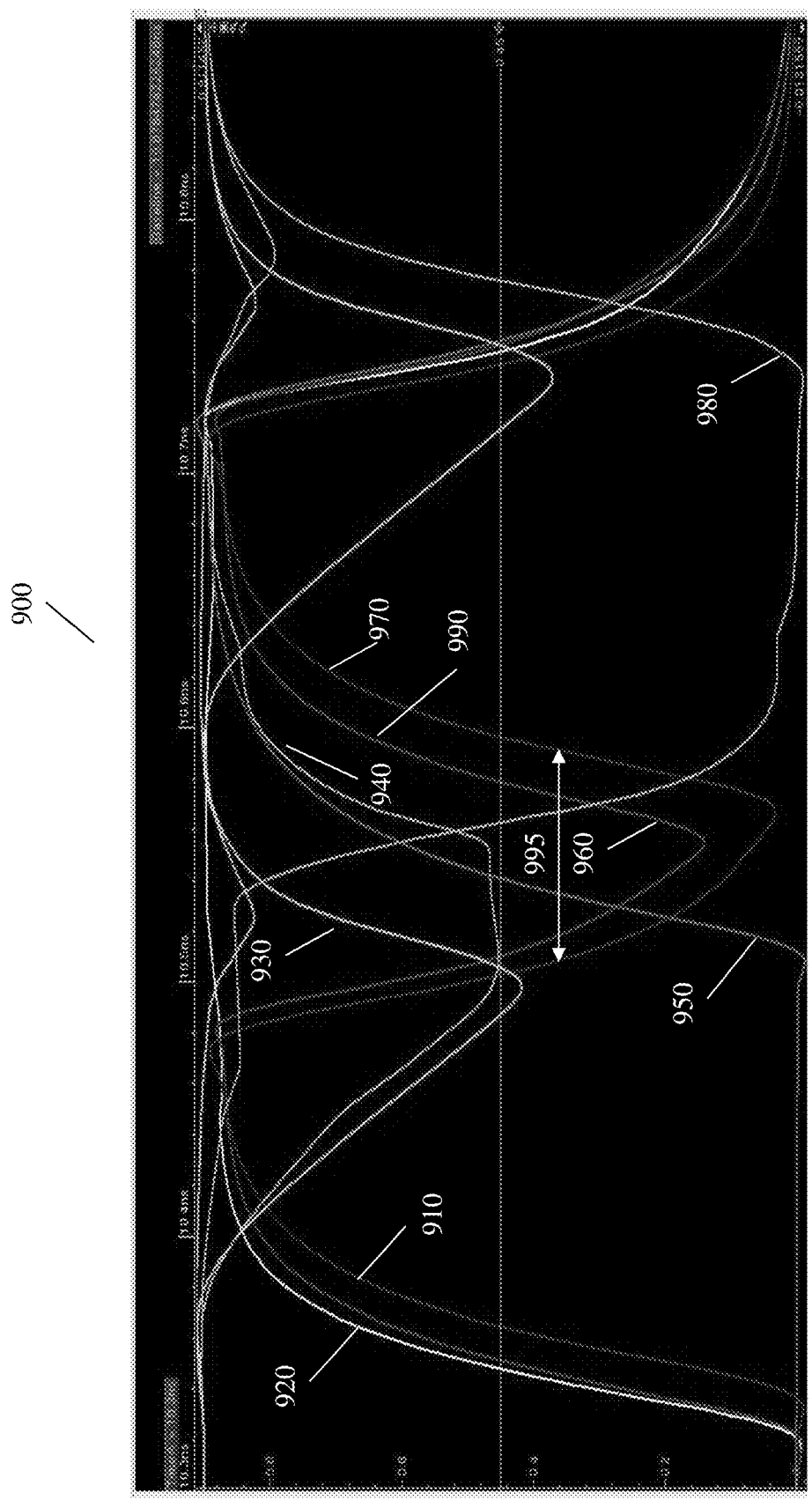
FIG. 9 shows a graph of the intracycle column dependent bit line restore for half selected cells structure in accordance with aspects of the present disclosure.

FIG. 9 shows a graph 900 of the intracycle column dependent bit line restore for half selected cells structure (i.e., which corresponds to FIGS. 4-6) in accordance with aspects of the present disclosure. In particular, the graph 900 of the intracycle column dependent bit line restore for half selected cells structure has an x-axis of nanoseconds and a y-axis of voltage.

In particular, the graph 900 includes the following lines: a read and write line (RWL) 910; a bit line restore signal (BLRN0) 920 for a selected column; a true bit line (BLT1) 930; a complement bit line (BLC0) 940; a write bit switch signal (WBS0) 950; a bit line restore signal (BLRN3) 960 for a half selected column; a write word line (WWL) 970; a true bit line (BLT0) 980; and a complement bit line (BLC1) 990. In FIG. 9, the graph 900 shows that the bit line for the half selected cells (i.e., BLRN3 960) is fully restored. Further, in FIG. 9, the graph 900 of the shows a 93 picosecond cycle time 995 in comparison to known systems with a 211 picosecond cycle time. In graph 900, the total cycle time is 495 picoseconds. Thus, the graph 900 discloses that a faster cycle time is enabled in the intracycle column dependent bit line restore for half selected cells structure.

The circuit and method for an intracycle bit line restore scheme of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and method for an intracycle bit line restore scheme of the present disclosure has been adopted from integrated circuit (IC) technology. For example, the structures are built on wafers and are realized in films of material patterned by photolithographic processes on the top of a wafer. In particular, the fabrication of the circuit and a method for an intracycle bit line restore scheme uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising at least one bit line restore device which is configured to precharge a bit line to a specified voltage during an intracycle time between a read operation and a write operation and is configured to be turned off during the read operation and the write operation,
   wherein the at least one bit line restore device comprises a first transistor and a second transistor,
   the first transistor is gated by a read bit switch signal and is between a power supply signal and a drain of the second transistor, and
   the second transistor is gated by a write bit switch signal and is between the first transistor and a drain of a third transistor.

2. The structure of claim 1, wherein the first transistor and the third transistor are NMOS transistors and the second transistor is a PMOS transistor.

3. The structure of claim 1, wherein the specified voltage is a difference between a voltage value of the power supply signal and a threshold voltage of the first transistor.

4. The structure of claim 1, further comprising a true and complement write driver which drives the bit line to the specified voltage.

5. The structure of claim 4, wherein the true and complement write driver drives the bit line to the specified voltage based on a PMOS transistor.

6. The structure of claim 4, wherein the true and complement write driver pulls another bit line to ground.

7. The structure of claim 6, wherein the another bit line is a complement signal with respect to the bit line.

8. The structure of claim 1, wherein the first transistor includes a drain directly connected to the power supply signal and a source directly connected to a source of the second transistor which includes the drain directly connected to the drain of the third transistor which is gated by the write bit switch signal and includes a source directly connected to a digit line complement write signal.

9. The structure of claim 8, wherein the drain of the third transistor is directly connected to a source of a fourth transistor which is gated by the read bit switch signal and has a drain directly connected to a digit line complement signal.

10. A method, comprising:
    turning off a bit line restore device during a read operation;
    precharging a bit line to a voltage difference between a voltage value of a power supply signal and a threshold voltage of a transistor in the bit line restore device; and
    turning off the bit line restore device during a write operation,
    wherein the bit line restore device comprises a first transistor and a second transistor,
    the first transistor is gated by a read bit switch signal and is between a power supply signal and a drain of the second transistor, and
    the second transistor is gated by a write bit switch signal and is between the first transistor and a drain of a third transistor.

11. The method of claim 10, wherein the precharging of the bit line occurs in an intracycle time between the read operation and the write operation using a true and complement write driver.

12. The method of claim 10, wherein the first transistor includes a drain directly connected to the power supply signal and a source directly connected to a source of the second transistor which includes the drain directly connected to the drain of the third transistor which is gated by the write bit switch signal and includes a source directly connected to a digit line complement write signal.

13. The method of claim 12, wherein the drain of the third transistor is directly connected to a source of a fourth transistor which is gated by the read bit switch signal and has a drain directly connected to a digit line complement signal.

* * * * *